United States Patent
Choi

(10) Patent No.: US 7,105,271 B2
(45) Date of Patent: Sep. 12, 2006

(54) NEGATIVE RESIST COMPOSITION COMPRISING HYDROXY-SUBSTITUTED BASE POLYMER AND SI-CONTAINING CROSSLINKER HAVING EPOXY RING AND A METHOD FOR PATTERNING SEMICONDUCTOR DEVICES USING THE SAME

(75) Inventor: Sang-Jun Choi, Seoul (KR)

(73) Assignee: Samsung Electronics, Co., LTD, Kyungki-do (KR)

( * ) Notice: Subject to any disclaimer, the term of this patent is extended or adjusted under 35 U.S.C. 154(b) by 222 days.

(21) Appl. No.: 10/400,097

(22) Filed: Mar. 26, 2003

(65) Prior Publication Data

US 2003/0235788 A1 Dec. 25, 2003

(30) Foreign Application Priority Data

Jun. 20, 2002 (KR) ................ 10-2002-0034624

(51) Int. Cl.
*G03F 7/075* (2006.01)
*G03F 7/40* (2006.01)

(52) U.S. Cl. .................. 430/270.1; 430/281.1; 430/905; 430/910; 430/914; 430/921; 430/925; 430/945

(58) Field of Classification Search .......... 430/270.1, 430/280.1, 905, 910, 914, 921, 925, 945
See application file for complete search history.

(56) References Cited

U.S. PATENT DOCUMENTS

| | | | | | |
|---|---|---|---|---|---|
| 5,736,619 | A | * | 4/1998 | Kane et al. | 525/393 |
| 5,981,141 | A | * | 11/1999 | Choi et al. | 430/270.1 |
| 6,187,934 | B1 | * | 2/2001 | Tsuji et al. | 549/529 |
| 2003/0232279 | A1 | * | 12/2003 | Choi | 430/280.1 |
| 2004/0058272 | A1 | * | 3/2004 | Takahashi et al. | 430/270.1 |

FOREIGN PATENT DOCUMENTS

| JP | 6059444 | 3/1994 |
|---|---|---|
| KR | 0182513 | 8/2001 |

OTHER PUBLICATIONS

Zhao et al., "Preparation and Properties of Polydimethylsiloxane–Modified Epoxy Resins", Journal of Applied Polymer Science, vol. 76, 1683–1690 (2000).*

Plueddemann et al., "Epoxyorganosiloxanes", Journal of American Chemical Society, 81, 2632–2635 (1959).*

* cited by examiner

*Primary Examiner*—Yvette C. Thornton
(74) *Attorney, Agent, or Firm*—F. Chau & Associates, LLC

(57) ABSTRACT

A negative resist composition and a method for patterning semiconductor devices using the composition are provided. The negative resist composition contains an alkali-soluble hydroxy-substituted base polymer, a silicon-containing crosslinker having an epoxy ring, and a photoacid generator. In the method for patterning semiconductor devices, fine patterns are formed according to a bi-layer resist process using the negative resist composition.

15 Claims, 2 Drawing Sheets

NEGATIVE RESIST COMPOSITION COMPRISING HYDROXY-SUBSTITUTED BASE POLYMER AND SI-CONTAINING CROSSLINKER HAVING EPOXY RING AND A METHOD FOR PATTERNING SEMICONDUCTOR DEVICES USING THE SAME

BACKGROUND OF THE INVENTION

This application claims priority to Korean Patent Application No. 2002-34624, filed on Jun. 20, 2002, the disclosure of which is incorporated herein by reference.

1. Field of the Invention

The present invention relates to a silicon-containing photoresist composition and a method for patterning a semiconductor device. More particularly, the present invention relates to a silicon-containing negative resist composition suitable for use in a bi-layer resist process, and a method for patterning semiconductor devices using the same.

2. Discussion of the Related Art

As the manufacture of semiconductor devices becomes more complicated and semiconductor devices become more highly integrated, there is a need to form fine patterns. Furthermore, with regard to 1-Gigabit or more semiconductor devices, a pattern size having a design rule of 0.2 µm or less is needed. Therefore, the use of conventional photoresist materials for KrF eximer laser (248 nm) is limited. For this reason, lithography techniques using ArF eximer laser (193 nm) or $F_2$ eximer laser (157 nm), which are shorter-wavelength energy sources than KrF eximer laser, have emerged. Lithography processes using $F_2$ eximer laser (157 nm) need resist materials having a new structure.

However, ArF and $F_2$ resist materials have many problems due to their structural limitations as compared with i-line or KrF resist materials, which include pattern collapse due to the fine pattern size and poor resistance to dry etching. Therefore, there is a need to develop new resist materials and processes therefor.

In a photolithography process for manufacturing highly integrated semiconductor devices, the application of a bi-layer resist (BLR) process improves characteristics such as dry-etching resistance and formation of high aspect ratio patterns.

In the BLR process, binary chemically amplified resists composed of a silicon-containing polymer having in its backbone silicon atom substituents and a photoacid generator, e.g., positive chemically amplified resists, have been widely used. Also, the development of highly sensitive resist materials for BLR processes using a short-wavelength light source has focused on positive chemically amplified resists. However, silicon-containing resist compositions developed to date for BLR processes have strong hydrophobicity and exhibit poor adhesion to the underlying layer. Also, it is difficult to control the amount of silicon to an appropriate level for resist materials.

The use of positive resists is limited in forming isolated patterns for high-speed, high-performance DRAMs. A lithography process for manufacturing 1-Gigabit or more DRAMs necessitates the use of a phase shift mask. In designing phase shift masks, using negative resists is more advantageous than using positive resists. Therefore, a need exists for developing negative resists which are highly transparent with respect to an exposure light source having a short wavelength, and exhibit high resolution and have a high resistance to dry-etching.

SUMMARY OF THE INVENTION

One aspect of the invention provides a negative resist composition having high transmittance in a short-wavelength region, and a high dry-etching resistance as it contains silicon. In addition, the negative resist composition can be effectively used in bi-layer resist (BLR) processes to secure a high resolution and a high aspect ratio.

The invention also provides a method for forming fine patterns having a high aspect ratio required for highly integrated semiconductor devices.

According to an embodiment of the present invention, the invention provides a negative resist composition comprising: an alkali-soluble hydroxy-substituted base polymer, a silicon-containing crosslinker having an epoxy ring, and a photoacid generator (PAG).

In the negative resist composition according to an embodiment of the present invention, the base polymer can be a Novolac resin partially or fully substituted with a hydroxy group.

The base polymer can be polyhydroxystyrene, and preferably, poly(2-hydroxystyrene), poly(3-hydroxystyrene), or poly(4-hydroxystyrene).

The base polymer comprises a (meth)acrylate repeating unit having a hydroxy group, and preferably, a 2-hydroxyethyl(meth)acrylate repeating unit or 3-hydroxypropyl(meth)acrylate repeating unit.

In the negative resist composition according to another embodiment of the present invention, the silicon-containing crosslinker can be a diglycidyl ether-terminated poly(dimethylsiloxane)oligomer or polymer. For example, the silicon-containing crosslinker can have the following formula:

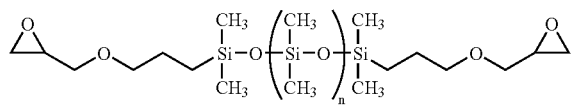

where n is an integer from 5 to 1000.

It is preferable that the silicon-containing crosslinker have a molecular weight of about 300 to about 30,000 and that the amount of the silicon-containing crosslinker is in the range of about 5.0% to about 50% by weight based on the total weight of the polymer base.

In the negative resist composition according to another embodiment of the present invention, the amount of the PAG is in the range of about 1.0% to about 10% by weight based on the total weight of the base polymer. The PAG is preferably a triarylsulfonium salt, a diaryliodonium salt, or a mixture of the forgoing salts, and more preferably, triphenylsulfonium triflate, diphenyliodonium triflate, di-t-butylphenyliodium triflate, or any combination thereof.

Alternatively, the negative resist composition according to another embodiment of the present invention further comprises an organic base. In this case, the amount of the organic base is in the range of about 0.01% to about 2.0% by weight based on the content of the PAG. It is preferable that the organic base be triethylamine, triisobutylamine, trioctylamine, triisodecylamine, triethanolamine, and any combination thereof.

According to another embodiment of the present invention, the invention provides a method for patterning a semiconductor device, in which fine patterns are formed according to a BLR process using the negative resist composition according to the embodiments described above. In the method, initially, a first resist layer is formed on a target layer to be etched on a semiconductor substrate. Next, a second resist layer is formed on the first resist layer by coating with the first resist layer with a negative resist composition according to the embodiments described above. The second resist layer is subjected to pre-baking and exposure processes. The exposed second resist layer is baked (post-exposure baking) and developed into a second resist layer pattern. The first resist layer is etched using the second resist layer pattern as an etching mask to form a first resist layer pattern. Lastly, the target layer is etched using the first resist layer pattern as an etching mask. In the exposure process, a KrF, ArF, or $F_2$ eximer laser is used.

According to another embodiment of the present invention, a negative resist composition, as described above, containing a hydroxy-substituted base polymer, a silicon-containing crosslinker having an epoxy ring, and a PAG provides good adhesion and wetability to the underlying layer.

According to another embodiment of the present invention, the negative resist composition is highly transparent in a short-wavelength region, such as the region of light emitted by a KrF, ArF, or $F_2$ eximer laser, and exhibits a high resolution and a high aspect ratio. Therefore, the negative resist composition according to the present invention can be effectively used in BLR processes and in forming fine patterns having a high aspect ratio required for highly integrated semiconductor devices.

BRIEF DESCRIPTION OF THE DRAWINGS

The above features and advantages of the present invention will become more apparent by describing in detail exemplary embodiments thereof with reference to the attached drawings in which.

DETAILED DESCRIPTION OF THE INVENTION

A negative resist composition according to an embodiment of the present invention contains as basic components an alkali-soluble hydroxy-substituted base polymer, a silicon-containing crosslinker having an epoxy ring, and a photoacid generator (PAG).

According to another embodiment of the present invention, the negative resist composition base polymer includes a Novolac resin partially or fully substituted with a hydroxy group and polyhydroxystyrene, such as poly(2-hydroxystyrene), poly(3-hydroxystyrene), poly(4-hydroxystyrene), and the like. The base polymer has a (meth)acrylate repeating unit having a hydroxy group, such as a 2-hydroxyethyl(meth)acrylate repeating unit, 3-hydroxypropyl(meth)acrylate repeating unit, and the like.

The silicon-containing crosslinker includes a diglycidyl ether-terminated poly(dimethylsiloxane)oligomer or polymer. For example, the silicon-containing crosslinker may have the following formula:

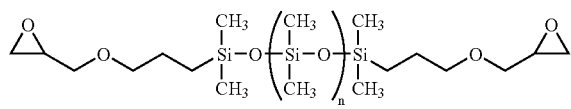

where n is an integer from 5 to 1000.

It is preferable that the silicon-containing crosslinker has a molecular weight of about 300 to about 30,000. The amount of the silicon-containing crosslinker may be in the range of about 5.0% to about 50% by weight based on the total weight of the polymer base.

In the negative resist composition according to another embodiment of the present invention, the amount of the PAG may be in the range of about 1.0% to about 10% by weight based on the total weight of the base polymer. The PAG includes preferably a triarylsulfonium salt, a diaryliodonium salt, or any combination thereof, and more preferably, triphenylsulfonium triflate, diphenyliodonium triflate, di-t-butylphenyliodium triflate, or any combination thereof.

The negative resist composition according to another embodiment of the present invention may further comprise an organic base. In this case, the amount of the organic base is in the range of about 0.01% to about 2.0% by weight based on the content of the PAG. It is preferable that the organic base be triethylamine, triisobutylamine, trioctylamine, triisodecylamine, triethanolamine, and any combination thereof.

FIGS. 1 through 4 are sectional views for illustrating a method for forming patterns in a semiconductor device according to an embodiment of the present invention.

Figure 1:
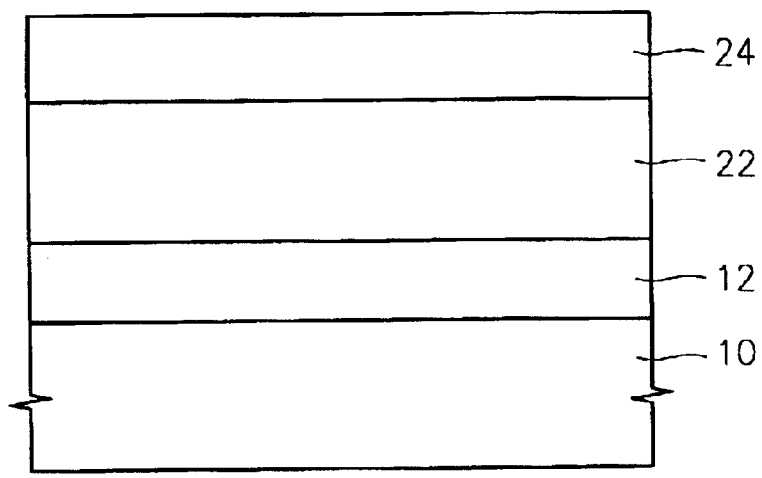
FIGS. 1 through 4 are sectional views for illustrating a method for forming patterns in a semiconductor device according to an embodiment of the present invention.

Referring to FIG. 1, a target layer 12 to be etched is formed on a substrate 10, for example, a semiconductor substrate or a transparent substrate. Next, in order to form a bi-layer resist (BLR) layer on the target layer 12, a first resist layer 22 is formed on the target layer 12 and then a second resist layer 24 having a thickness of about 100 nm to about 500 nm is formed by coating the first resist layer 22 with a silicon-containing negative resist composition by spin coating and pre-baking the coated layer. The second resist layer 24 is formed using the negative resist composition according to the present invention described above. In other words, the second resist layer 24 basically contains an alkali-soluble hydroxy-substituted base polymer, a silicon-containing crosslinker having an epoxy ring, and a PAG.

Figure 2:
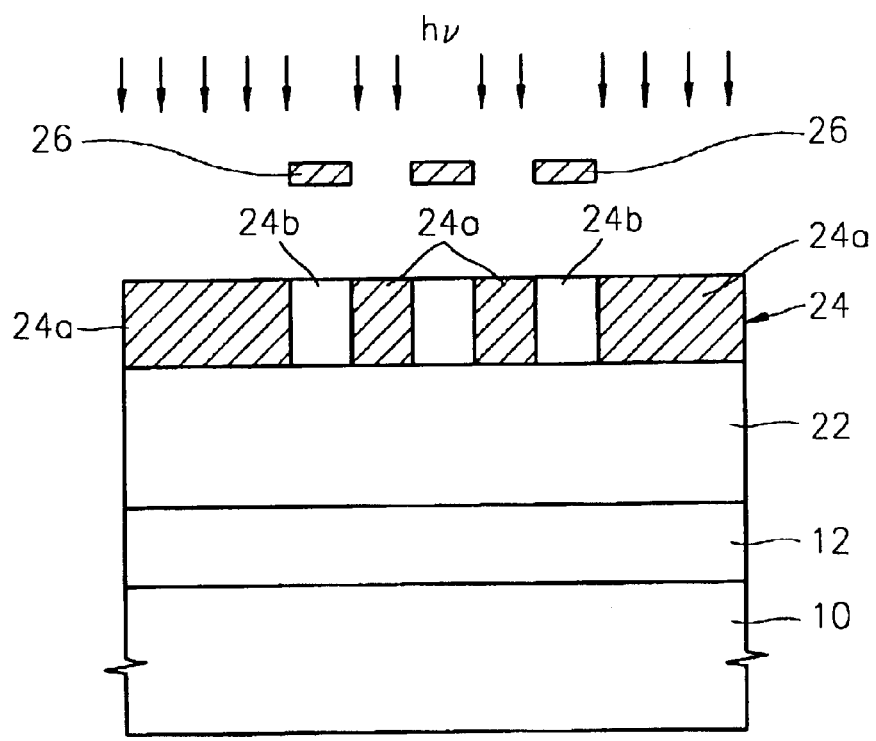

Referring to FIG. 2, a selected region of the second resist layer 24 is exposed through a mask 26 using a KrF, ArF, or $F_2$ eximer laser, so that an exposed region 24a and a non-exposed region 24b result in the second resist layer 24.

Next, the exposed second resist layer 24 is subjected to a post-exposure baking (PEB) process. As a result, in the exposed region 24a of the second resist layer 24 a crosslinking reaction takes place due to the acid generated from the PAG.

Figure 3:
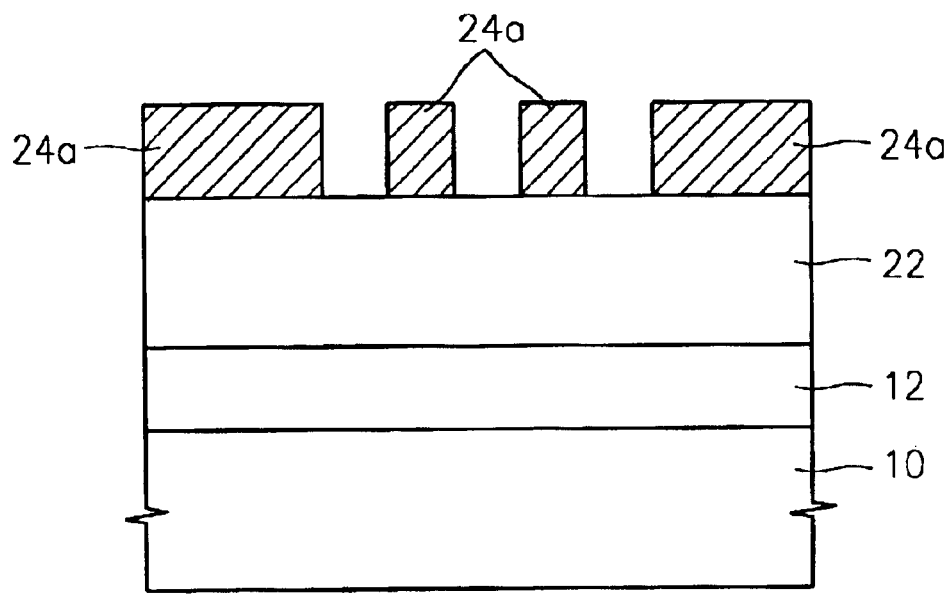

Referring to FIG. 3, the exposed second resist layer 24 is developed using an alkaline developer solution, such as tetramethylammonium hydroxide (TMAH) solution, to remove the non-exposed region 24b and form a second resist layer pattern 24a, which is a negative pattern of the exposed region 24a.

Figure 4:
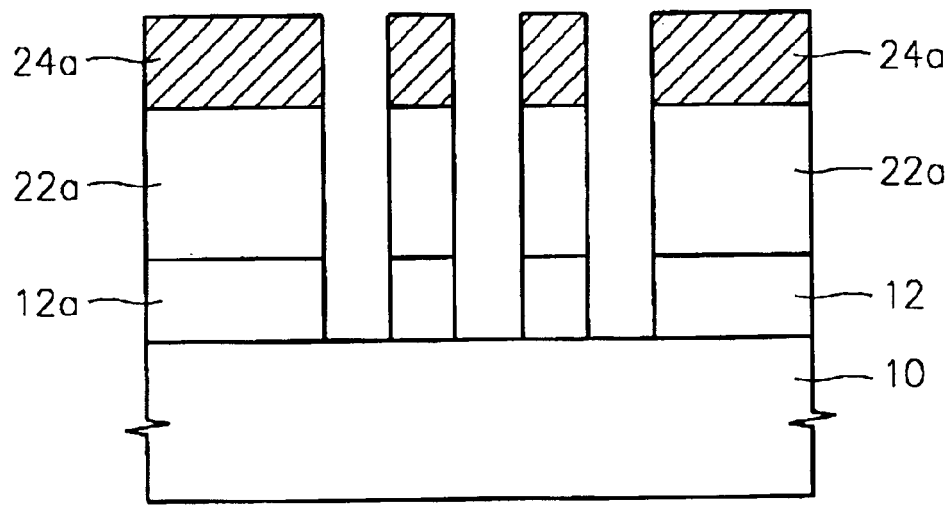

Referring to FIG. 4, the first resist layer 22 is etched using the second resist layer pattern 24a as an etching mask to form a first resist layer pattern 22a. Subsequently, the target layer 12 is etched into a desired pattern 12a using the first resist layer pattern 22a as an etching mask.

The present invention will be described in greater detail with reference to the following examples. Various changes can be made in the following examples and thus the scope of the invention is not limited to the following examples.

SYNTHESIS EXAMPLE 1

Synthesis of Base Polymer having Hydroxyethyl Methacrylate Repeating Unit

In a round bottom flask, about 13 g (100 mmol) of 2-hydroxyethyl methacrylate was placed and dissolved in about 40 g of tetrahydrofuran (THF) with an addition of about 0.82 g (5 mol %) of azobisisobutyronitrile (AIBN). After purging with nitrogen gas, the mixture was subjected to polymerization at a temperature of about 65° C. for about 20 hours.

After the polymerisation was completed, the reaction product was slowly precipitated in excess n-hexane solution, and the precipitate was filtered. The precipitate was dissolved again in an appropriate amount of THF and reprecipitated in n-hexane solution. The resulting precipitate was dried in a vacuum oven at about 50° C. for about 24 hours to obtain a desired polymer with a yield of about 75%.

The resulting polymer had a weight average molecular weight (Mw) of about 15,500 and a polydispersity (Mw/Mn) of about 2.0.

SYNTHESIS EXAMPLE 2

Synthesis of Base Polymer having Hydroxyethyl Methacrylate Repeating Unit and Styrene Repeating Unit A desired polymer was synthesized with a yield of about 75% in the same manner as in synthesis example 1 except that about 9.1 g (50 mmol) of 2-hydroxyethyl methacrylate and about 3 g (30 mmol) of styrene were polymerized.

The resulting polymer had an average molecular weight (Mw) of about 14,300 and a polydispersity (Mw/Mn) of about 2.1.

SYNTHESIS EXAMPLE 3

Synthesis of Polyhydroxystyrene Base Polymer

About 12 g (0.1 mol) of polyhydroxystyrene (Mw=12,000, Mw/Mn=1.1) and about 24 g (0.3 mol) of 2-chloroethanol were dissolved in about 100 mL of THF together with 0.12 mol of triethylamine and reacted at reflux for about 12 hours.

After the reaction was completed, the reaction product was slowly precipitated in an n-hexane solution, and the precipitate was filtered. The precipitate was dissolved again in an appropriate amount of THF and reprecipitated in an n-hexane solution. The resulting precipitate was dried in a vacuum oven at about 50° C. for about 24 hours to obtain a desired polymer with a yield of about 80%.

SYNTHESIS EXAMPLE 4

Synthesis of Epoxy Novolac Resin Base Polymer

A desired polymer was synthesized in the same manner as in synthesis example 3 except that an i-line Novolac resin and 2-chloroethanol were used.

EXAMPLE 1

Preparation of Resist Composition and its Lithography Performance

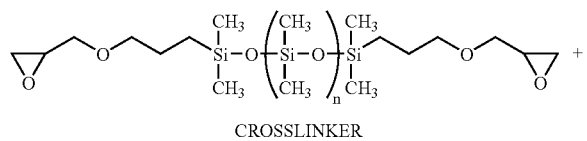

CROSSLINKER

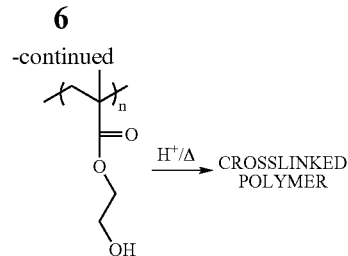

One gram of the polymer synthesized in synthesis example 1, about 0.2 g of crosslinker diglycidyl ether-terminated poly (dimethylsiloxane) (viscosity=15 cSt, Aldrich Chemical Co.), and about 0.02 g of photoacid generator triphenylsulfonium triflate were dissolved in about 8 g propylene glycol methyl ether acetate (PGMEA), followed by an addition of about 1 mg of organic base truisobutylamine to completely dissolve the materials. The resulting resist solution was filtered using a 0.2 μm-membrane filter.

The filtered resist solution was coated on a bare silicon wafer, which had been treated with hexamethyldisilazne (HMDS), to a thickness of about 0.30 μm, followed by soft backing at about 120° C. for about 90 seconds and exposure using an ArF eximer laser stepper (NA=0.6 and σ=0.75).

Next, the wafer with the resist layer was subjected to post-exposure baking (PEB) at about 120° C. for about 60 seconds and development in about 2.38% by weight of a tetramethylammonium hydroxide (TMAH) solution for about 60 seconds. As a result, a sharp line and space pattern having a width of about 180 nm was obtained with an exposure dose of about 15 mJ/cm².

EXAMPLE 2

Preparation of Resist Composition and its Lithography Performance

Different photoresist compositions were prepared using about 1 g of each of the polymers synthesized in synthesis examples 2 through 4 in the same manner as in example 1, and lithography performance was evaluated. For all of the photoresist compositions, a sharp line and space pattern having a width of about 180 nm was obtained with an exposure dose of about 15 mJ/cm².

As described above, a negative resist composition according to another embodiment of the present invention includes an alkali-soluble hydroxy-substituted base polymer, a silicon-containing crosslinker having an epoxy ring, and a PAG. In other words, unlike conventional resist compositions for use in BLR processes, most of which contain silicon atom substituted into the polymer backbone, in the negative resist composition according to an embodiment of the present invention silicon atom is incorporated into the crosslinker. Accordingly, the amount of silicon in the negative resist composition can be more easily controlled, and the negative resist composition has a high dry-etching resistance due to the silicon. In addition, since the negative resist composition contains the hydroxy-substituted base polymer and the crosslinker having an epoxy ring, its adhesion and wetability to the underlying layer can be easily controlled. The negative resist composition according to another embodiment of the present invention is highly transparent in a short-wavelength region, such as the region of light emitted by a KrF, ArF, or $F_2$ eximer laser, and exhibits high resolution and has a high aspect ratio. Therefore, the negative resist composition according to the present invention can be effectively used in BLR processes and in forming fine patterns having a high aspect ratio required for highly integrated semiconductor devices.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A negative resist composition comprising:

an alkali-soluble base polymer substituted with a hydroxy group, wherein the base polymer is a Novolac resin partially or fully substituted with a hydroxy group;

a silicon-containing crosslinker having an epoxy ring; and a photoacid generator.

2. The negative resist composition of claim 1, wherein the silicon-containing crosslinker has a molecular weight of about 300 to about 30,000.

3. The negative resist composition of claim 1, wherein the amount of the silicon-containing crosslinker is in the range of about 5.0% to about 50% by weight based on the total weight of the base polymer.

4. The negative resist composition of claim 1, wherein the amount of the photoacid generator is in the range of about 1.0% to about 10% by weight based on the total weight, of the base polymer.

5. The negative resist composition of claim 1, wherein the photoacid generator is a triarylsulfonium salt, a diaryliodonium salt, or any combination thereof.

6. The negative resist composition of claim 5, wherein the photoacid generator is triphenylsulfonium triflate, diphenyliodonium triflate, di-t-butylphenyliodium triflate, or any combination thereof.

7. A negative resist composition comprising:

an alkali-soluble base polymer substituted with a hydroxy group;

a silicon-containing crosslinker having an epoxy ring; and a photoacid generator, wherein the base polymer is a polyhydroxystyrene.

8. The negative resist composition of claim 7, wherein the base polymer is poly(2-hydroxystyrene), poly(3-hydroxystyrene), or poly(4-hydroxystyrene).

9. A negative resist composition comprising:

an alkali-soluble base polymer substituted with a hydroxy group;

a silicon-containing crosslinker having an epoxy ring; and a photoacid generator, wherein the base polymer comprises a (meth)acrylate repeating unit having a hydroxy group.

10. The negative resist composition of claim 9, wherein the base polymer comprises a 2-hydroxyethyl(meth)acrylate repeating unit or a 3-hydroxypropyl(meth)acrylate repeating unit.

11. A negative resist composition comprising:

an alkali-soluble base polymer substituted with a hydroxy group;

a silicon-containing crosslinker having an epoxy ring; and a photoacid generator, wherein the silicon-containing crosslinker is a diglycidyl ether-terminated poly(dimethylsiloxane)oligomer or polymer.

12. The negative resist composition of claim 11, wherein the silicon-containing crosslinker has the following formula:

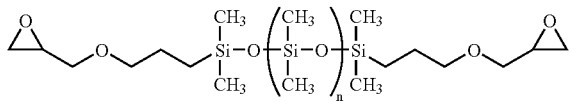

where n is an integer from 5 to 1000.

13. A negative resist composition comprising:

an organic base polymer substituted with a hydroxy group;

a silicon-containing crosslinker having an epoxy ring; and a photoacid generator, wherein the silicon-containing crosslinker is a diglycidyl ether-terminated poly(dimethylsiloxane)oligomer or polymer.

14. The negative resist composition of claim 13, wherein the amount of the organic base is in the range of about 0.01% to about 2.0% by weight based on the content of the photoacid generator.

15. The negative resist composition of claim 13, wherein the organic base is selected from the group consisting of triethylamine, triisobutylamine, trioctylamine, triisodecylaniine, triethanolamine, and any combination thereof.

* * * * *